(12) United States Patent
Paik et al.

(10) Patent No.: US 9,196,811 B2
(45) Date of Patent: Nov. 24, 2015

(54) OPTICAL DEVICE PACKAGE HAVING A GROOVE IN THE METAL LAYER

(75) Inventors: Jee Heum Paik, Seoul (KR); Sang Ki Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 16 days.

(21) Appl. No.: 14/236,016

(22) PCT Filed: Jul. 27, 2012

(86) PCT No.: PCT/KR2012/006009
§ 371 (c)(1),
(2), (4) Date: Jan. 29, 2014

(87) PCT Pub. No.: WO2013/019032
PCT Pub. Date: Feb. 7, 2013

(65) Prior Publication Data
US 2014/0183592 A1    Jul. 3, 2014

(30) Foreign Application Priority Data

Jul. 29, 2011    (KR) .................. 10-2011-0076048

(51) Int. Cl.
| | |
|---|---|
| H01L 21/00 | (2006.01) |
| H01L 33/00 | (2010.01) |
| H01L 33/62 | (2010.01) |
| H01L 33/54 | (2010.01) |
| H01L 33/48 | (2010.01) |

(52) U.S. Cl.
CPC ............. *H01L 33/62* (2013.01); *H01L 33/54* (2013.01); *H01L 33/486* (2013.01); *H01L 2224/48091* (2013.01); *H01L 2224/48465* (2013.01); *H01L 2224/92247* (2013.01); *H01L 2933/005* (2013.01)

(58) Field of Classification Search
CPC ....... H01L 33/54; H01L 33/62; H01L 33/486; H01L 2933/005; H01L 2224/48091; H01L 2224/92247; H01L 31/0203
See application file for complete search history.

(56) References Cited

U.S. PATENT DOCUMENTS

| | | | |
|---|---|---|---|
| 7,642,563 B2 * | 1/2010 | Kang et al. ................ | 257/99 |
| 8,138,512 B2 * | 3/2012 | Kang et al. ................ | 257/98 |
| 8,207,019 B2 * | 6/2012 | Lin et al. ................... | 438/122 |

(Continued)

FOREIGN PATENT DOCUMENTS

| | | |
|---|---|---|
| KR | 10-2010-0008509 A | 1/2010 |
| KR | 10-2010-0036146 A | 4/2010 |

(Continued)

OTHER PUBLICATIONS

International Search Report in International Application No. PCT/KR2012/006009, filed Jul. 27, 2012.

*Primary Examiner* — Alonzo Chambliss
(74) *Attorney, Agent, or Firm* — Saliwanchik, Lloyd & Eisenschenk

(57) ABSTRACT

Provided are an optical device package and a method of manufacturing the same. The method of manufacturing the optical device package according to an exemplary embodiment of the present invention comprises: forming a metal layer on an insulating layer on which via holes are formed; forming a circuit pattern layer by etching the metal layer; forming a boundary part in a predetermined part of the metal layer; mounting an optical device on the circuit pattern layer; and forming a molding part by applying a transparent material to the optical device, wherein the predetermined part is a part corresponding to a boundary of the molding part.

12 Claims, 4 Drawing Sheets

(56) References Cited

U.S. PATENT DOCUMENTS

| | | | |
|---|---|---|---|
| 8,236,618 B2 * | 8/2012 | Lin et al. | 438/122 |
| 8,288,792 B2 * | 10/2012 | Lin et al. | 257/99 |
| 8,310,043 B2 * | 11/2012 | Lin et al. | 257/706 |
| 8,324,723 B2 * | 12/2012 | Lin et al. | 257/707 |
| 8,535,985 B2 * | 9/2013 | Lin et al. | 438/122 |
| 2011/0039374 A1 * | 2/2011 | Lin et al. | 438/118 |
| 2011/0278624 A1 * | 11/2011 | Nam | 257/98 |

FOREIGN PATENT DOCUMENTS

| | | |
|---|---|---|
| KR | 10-2010-0100229 A | 9/2010 |
| KR | 10-2010-0134278 A | 12/2010 |
| WO | WO-2010-061433 A1 | 6/2010 |

* cited by examiner

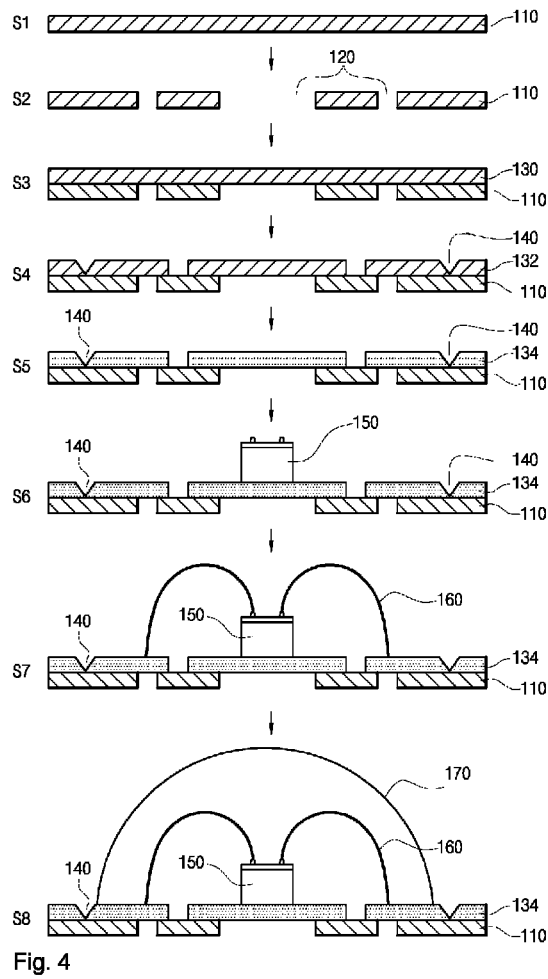
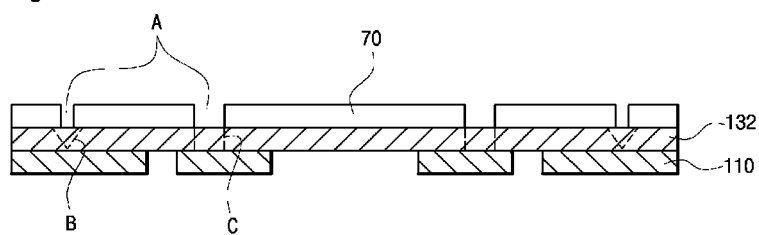

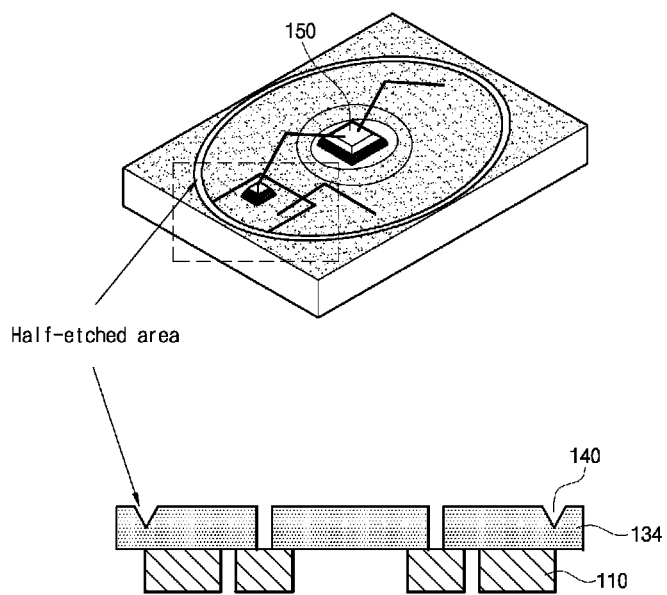

OPTICAL DEVICE PACKAGE HAVING A GROOVE IN THE METAL LAYER

CROSS-REFERENCE TO RELATED APPLICATIONS

This application is the U.S. national stage application of International Patent Application No. PCT/KR2012/006009, filed Jul. 27, 2012, which claims priority to Korean Application No. 10-2011-0076048, filed Jul. 29, 2011, the disclosures of each of which are incorporated herein by reference in their entirety.

TECHNICAL FIELD

Exemplary embodiments of theme present invention relates to an optical device package and a method of manufacturing the same.

BACKGROUND ART

In general, an optical device, namely, a light emitting diode (LED) is called an inter-metallic compound joining diode which produces minority carriers (electrons or electron holes) injected using a p-n junction structure of a semiconductor, and emits light by changing electrical energy into light energy due to a recombination of these carriers. That is, when a forward voltage is applied to a semiconductor of a specific element, electrons and electron holes are rejoined each other while the electrons and electron holes move through a junction part of a positive pole and a negative pole. At this time, since energy smaller than when the electrons and the electron holes are apart is generated, the light is emitted due to a difference of the generated energy. This LED is applied to a lighting device or a backlight device of an LCD device as well as a general display device, and its application range has been gradually diversified.

FIG. 1 is a view showing a cross-section view of an optical device package according to a conventional art.

Referring to FIG. 1, the conventional optical device package in a film type includes: an insulating film layer 10, a circuit pattern 20 layer implemented on the insulating film layer 10, and an optical device 30 mounted on the circuit pattern layer 20. The optical device 30 is electrically connected to the circuit pattern layer 20 through a wire 40. A molding part 60 is formed by applying a transparent resin including a fluorescent substance to the optical device 30 to improve light efficiency of the optical device. Before the molding part 60 is formed, a barrier part 50 is formed on the circuit pattern layer 20.

FIG. 2 is a view for explaining the barrier part of the optical device package according to the conventional art.

Referring to FIG. 2, the barrier part 50 is formed on the circuit pattern layer 20 with solder resist using a silk print method or a PSR (Photo Solder Resist) method before the optical device 30 is mounted on the circuit pattern 30. The barrier part 50 is formed to surround the optical device 30 so that when the transparent resin for the molding part 60 is applied to the optical device 30, the transparent resin does not flow over the barrier part 50.

It is problematic that the process for forming the barrier part 50 is complex, and there is a high possibility that a lower plated surface will be discolored due to hume generated around the solder resist.

Accordingly, it has been required to delete the process for forming the barrier part using the solder resist, simplify the process and remove the possibility that a discoloration problem will be generated.

DISCLOSURE OF INVENTION

Technical Problem

An aspect of exemplary embodiments of the present invention provides an optical device package and a method of manufacturing the same in which a manufacturing process is simplified and the possibility of a discoloration problem caused by forming a barrier part is removed.

Solution to Problem

According to an aspect of exemplary embodiments of the present invention, there is provided a method of manufacturing an optical device package, the method comprising: forming a metal layer on an insulating layer on which via holes are formed; forming a circuit pattern layer by etching the metal layer; forming a boundary part in a predetermined part of the metal layer; mounting an optical device on the circuit pattern layer; and applying a transparent material to the optical device to thereby form a molding part, wherein the predetermined part is a part corresponding to a boundary of the molding part.

The method of manufacturing the optical device package may further include plating the circuit pattern layer with a metallic material.

The method of manufacturing the optical device package may further include electrically connecting the optical device and the circuit pattern layer using a wire.

The boundary part may have a groove shape.

The forming of the circuit pattern layer and the forming of the boundary part may be simultaneously carried out by the etching.

The method of manufacturing the optical device package may further include forming an opened area of photoresist corresponding to the boundary part to be narrower than an area of the boundary part before the etching.

The forming of the boundary part may be realized by half-etching.

The optical device package includes: an insulating layer on which via holes are formed; a circuit pattern layer formed on one surface of the insulating layer; an optical device mounted on the circuit pattern layer; a molding part formed of a transparent material on the optical device; and a boundary part formed in a part corresponding to a boundary of the molding part.

The circuit pattern layer may be plated with a metallic material.

The metallic material may be Ag.

The optical device package may further include a wire which electrically connects the optical device and the circuit pattern layer.

The boundary part may have a groove shape.

The transparent material may include a transparent silicon resin, epoxy resin and glass.

The boundary part may have a shape of a circle or an ellipse.

Advantageous Effects of Invention

According to exemplary embodiments of the present invention, because the boundary part is formed in an area in which the transparent material is applied to the metal layer on which the circuit pattern layer is formed, namely, the part corresponding to the boundary of the molding part, when forming the molding part, the transparent material cannot flow over the area bounded by the boundary part, and the molding part can be aligned in a proper position. Thus, a manufacturing process is simplified, and the possibility of a discoloration problem caused by forming the barrier part is removed.

BRIEF DESCRIPTION OF DRAWINGS

The accompanying drawings are included to provide a further understanding of exemplary embodiments of the present invention, and are incorporated in and constitute a part of this specification. The drawings illustrate exemplary embodiments of the present invention and, together with the description, serve to explain principles of the present invention. In the drawings:

FIG. 3 is a view showing a manufacturing process of an optical device package according to an exemplary embodiment of the present invention.

FIG. 4 is a view showing a process for forming a boundary part according to another exemplary embodiment of the present invention.

FIG. 5 is view for explaining a boundary part of an optical device package according to still another exemplary embodiment of the present invention.

BEST MODE FOR CARRYING OUT THE INVENTION

Figure 1:
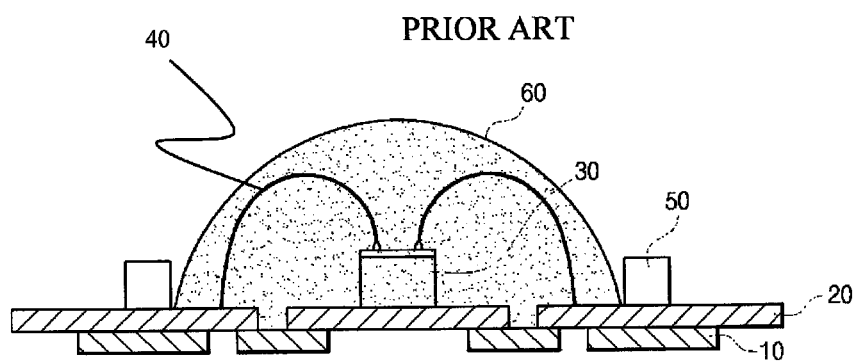
FIG. 1 is a view showing a cross-section view of a light emitting diode package according to a conventional art.
Figure 2:
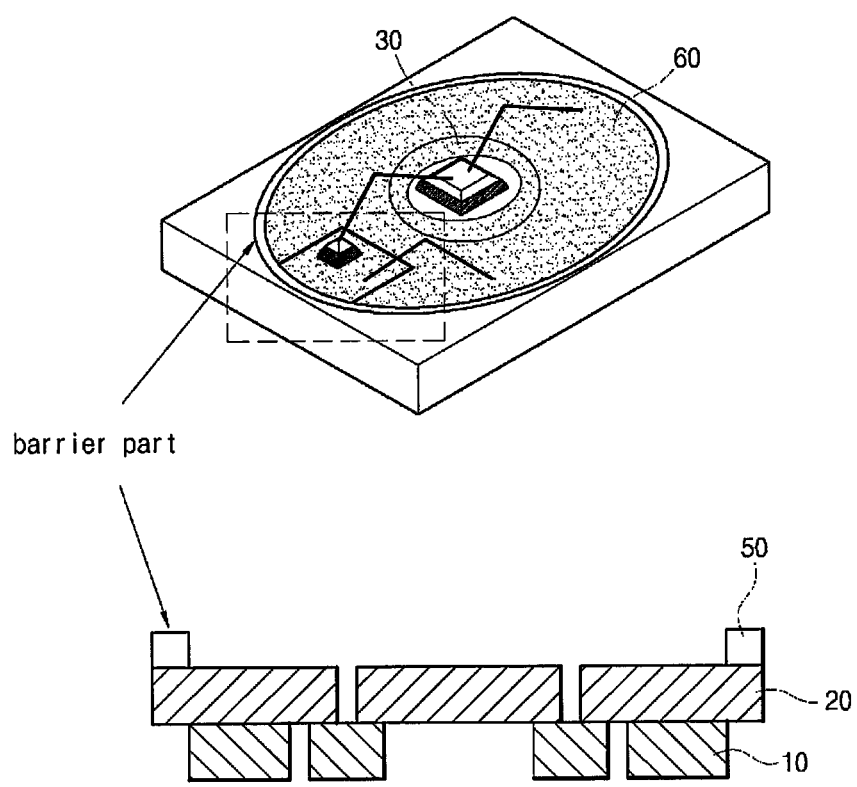
FIG. 2 is a view for explaining a barrier part of the optical device package according to the conventional art.

Exemplary embodiments according to the present invention will now be described more fully hereinafter with reference to the accompanying drawings so that those having ordinary skill in the art can easily embody. This invention may, however, be embodied in different forms and should not be construed as limited to the exemplary embodiments set forth herein. To clearly explain exemplary embodiments of the present invention, in the drawings, the parts which have no relation with the explanation are omitted. Like numbers refer to like elements throughout the specification.

Hereinafter, the detailed technical contents to be carried out by exemplary embodiments of the present invention will be described in detail with reference to the accompanying drawings.

FIG. 3 is a view showing a manufacturing process of an optical device package according to an exemplary embodiment of the present invention.

Referring to FIG. 3, an adhesive layer is applied to one surface of an insulating layer 110 (S1). Here, the insulating layer 110 may be a polyimide film, but not limited to this. The insulating layer may be also manufactured of a ceramic material which is resist to a heat shock. Furthermore, the insulating layer 110 may have a film shape. In this case, the insulating layer may be manufactured in large quantities by using a roll-to-roll process.

Next, via holes 120 are formed on the insulating layer 110 (S2). The via holes formed by passing through the insulating layer 100 may include a via hole on which an optical device 150 is mounted, a via hole for electrically connecting each layers, a thermal via hole for easily diffusing heat, and a via hole which is a standard to align each layer.

Next, a metal layer 130 is laminated on the insulating layer 110. The metal layer 130 may be composed of a Cu thin plate. Then, after a surface thereof is activated through several chemical treatments, photoresist is applied thereto, and an exposure process and a developing process are carried out. After the developing process is completed, a necessary circuit is formed by an etching process, and a circuit pattern 132 is formed by making the photoresist thin (S4). At the same time or in order, a boundary part 140 is formed in an edge of an area in which a transparent material is applied to the circuit pattern layer 132, namely, a part corresponding to a boundary of a molding part. The boundary part 140 corresponds to a boundary between the molding part and the circuit pattern layer 132. Accordingly, the boundary part 140 has a shape of roughly a circle or an ellipse.

The boundary part 140 may be formed by half-etching. The half-etching may make a thickness of the metal layer 130 thin. That is, the half-etching may reduce a thickness of a part of metal layer 130 corresponding to a boundary of an area to which a transparent resin is applied.

In other words, the boundary part 140 may be formed by half-etching a predetermined area or part of the metal layer 130. The boundary part 140 may be formed in a groove shape on the metal layer 130, namely, the circuit pattern layer 132.

According to an exemplary embodiment, a process for forming the circuit pattern layer 132 may simultaneously be performed with a process for forming the boundary part 140. That is, the process for forming the circuit pattern layer 132 and the process for forming the boundary part 140 may be simultaneously performed by one etching process. This is explained with reference to FIG. 4.

FIG. 4 is a view showing the process for forming the boundary part according to another exemplary embodiment of the present invention.

Referring to FIG. 4, etching for forming the circuit pattern layer 132 and etching for forming the boundary part 140 may be simultaneously performed. At this time, a developing area for the etching of the circuit pattern layer 132 and a developing area for the etching of the boundary part 140 may be adjusted. Here, the developing area is called an area A which is opened so that an etching liquid can come into contact with the metal layer 130 in the photoresist 70 patterned for etching.

When etching a part in which the developing area is wide and a part in which the developing area is narrow, etching speeds of the parts are different from each other. To narrow the developing area means that a size of the developing area (A) is formed smaller than a size of a part B to be etched. To widen the developing area means that the size A of the developing area (A) is formed larger than a size of a part C to be etched.

As a result, a part of the metal layer 130 corresponding to the area in which the developing area is wide is completely removed at the time of etching, but a part of the metal layer 130 corresponding to the area in which the developing area is narrow is not completely removed at the time of etching. That is, the part of the metal layer 130 corresponding to the area in which the developing area is narrow is half-etched.

To achieve this, before the etching process for forming the circuit pattern layer is performed, a process for widening the opened area of the photoresist corresponding to a pattern of the circuit pattern layer and a process for narrowing the opened area of the photoresist corresponding to the boundary part may be performed. That is, the process for manufacturing the optical device package may include a process for making the opened area of the photoresist corresponding to the boundary part narrower than the area of the boundary part before performing the etching process.

According to another exemplary embodiment, the processes for forming the circuit pattern layer 132 and the boundary part 140 may be sequentially performed. In this case, orders of the processes for forming the circuit pattern layer and the boundary part may be changed depending upon process conditions and process designs.

In the present exemplary embodiment, the boundary part 140 is formed by making the thickness of the metal layer 130 thin, but exemplary embodiments of the present invention is are not limited to this. For example, the boundary part 140 may be formed by passing through the metal layer 110. In this case, the boundary part 140 may be simultaneously formed with the circuit pattern layer 132 without the need to adjust a width of the developing area.

After the circuit pattern layer 132 is formed, the circuit pattern layer 132 is plated with a metallic material, for example, Ag to thereby form a plated circuit pattern layer 134 (S5). Next, the optical device 150 is mounted on the plated circuit pattern layer 134 (S6). A position where the optical device 150 is mounted may be easily distinguished by the boundary part 140. As a result, the molding part, for example, a lens part, may be aligned in a proper position.

Thanks to the plating of the circuit pattern layer 132, the more light emitted from the optical device 150 may be reflected from the plated circuit pattern layer 134. Accordingly, luminance of the optical device package can be enhanced. Next, the optical device 150 is electrically connected to the plated circuit pattern layer 134 through a wire 160 (S7).

Finally, the optical device 150 and the wire 160 are molded or encapsulated with a transparent material to thereby form the molding part 170. The transparent material may include a transparent silicon resin, epoxy resin and glass. Here, the molding part 170 serves as a lens for diffusing light and is also called the lens part.

FIG. 5 is a view for explaining the boundary part of the optical device package according to still another exemplary embodiment of the present invention.

Referring to FIG. 3 and FIG. 5, the optical device package may include the insulating Layer 110 on which the via holes are formed; the circuit pattern layer 134 formed on one surface of the insulating layer the optical device 150 mounted on the circuit pattern layer 134; and the molding part 170 formed by applying the epoxy resin to the optical device. The optical device 150 and the circuit pattern layer 134 are electrically connected through the wire.

Furthermore, the optical device package may include the boundary part 140 formed in the part corresponding to the boundary of the molding part 170. The boundary part 140 may be formed on the circuit pattern layer 134 so as to have the groove shape.

When forming the molding part 170, a molding material does not flow over the area bounded by the boundary part 140. In other words, to form the molding part 170, when the molding material is applied to the optical device 150 and the wire 160, the molding material flows into the boundary part 140 formed on the circuit pattern layer 134, namely, a groove 140. As a result, unless the molding material flows over the boundary part 140, the molding material 140 does not flow out from the boundary part 140, thereby easily forming the molding part 170.

Furthermore, the boundary part 140 may specify an area for forming the molding part 170. Thus, a position where the molding part 170 is formed may be easily distinguished.

As previously described, in the detailed description of the invention, having described the detailed exemplary embodiments of the invention, it should be apparent that modifications and variations can be made by persons skilled without deviating from the spirit or scope of the invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims and their equivalents.

The invention claimed is:

1. A method of manufacturing an optical device package comprising:
   forming a metal layer on an insulating layer on which via holes are included;
   forming a circuit pattern layer by etching the metal layer;
   forming a boundary part in a predetermined part of the metal layer;
   mounting an optical device on the circuit pattern layer; and
   forming a molding part by applying a transparent material to the optical device,
   wherein the predetermined part is a part corresponding to a boundary of the molding part, and
   wherein the boundary part includes a groove shape.

2. The method of claim 1, further comprising plating the circuit pattern layer with a metallic material.

3. The method of claim 1, further comprising electrically connecting the optical device and the circuit pattern layer using a wire.

4. The method of claim 1, wherein the forming of the circuit pattern layer and the forming of the boundary part are simultaneously performed by the etching.

5. The method of claim 1, wherein the forming of the boundary part is achieved by half-etching.

6. A method of manufacturing an optical device package comprising:
   forming a metal layer on an insulating layer on which via holes are included;
   forming a circuit pattern layer by etching the metal layer;
   forming a boundary part in a predetermined part of the metal layer;
   mounting an optical device on the circuit pattern layer; and
   forming a molding part by applying a transparent material to the optical device,
   wherein the redetermined part is a part corresponding to a boundary of the molding part,
   wherein the forming of the circuit pattern layer and the forming of the boundary part are simultaneously performed by the etching, and
   wherein the method further comprises making an opened area of photoresist corresponding to the boundary part narrower than an area of the boundary part before performing the etching.

7. An optical device package comprising:
   an insulating layer on which via holes are included;
   a circuit pattern layer on one surface of the insulating layer;
   an optical device mounted on the circuit pattern layer;
   a molding part on the optical device; and
   a boundary part formed in a part corresponding to a boundary of the molding part,
   wherein the boundary part includes a groove shape.

8. The optical device package of claim 7, wherein the circuit pattern layer is plated with a metallic material.

9. The optical device package of claim 8, wherein the metallic material is Ag.

10. The optical device package of claim 7, further comprising a wire which electrically connects the optical device and the circuit pattern layer.

11. The optical device package of claim 7, wherein the molding part includes a transparent silicon resin, epoxy resin and glass.

12. The optical device package of claim 7, wherein the boundary part has a shape of a circle or an ellipse.

\* \* \* \* \*